United States Patent [19]

Lee

[11] Patent Number: 5,770,026

[45] Date of Patent: Jun. 23, 1998

[54] SEMICONDUCTOR FABRICATION APPARATUS HAVING IMPROVED SPUTTERING COLLIMATOR AND WIRING METHOD FOR A SEMICONDUCTOR DEVICE USING SUCH APPARATUS

[75] Inventor: Chang-Jae Lee, Choongcheongbuk-Do, Rep. of Korea

[73] Assignee: LG Semicon Co., Ltd., Cheongju, Rep. of Korea

[21] Appl. No.: 785,694

[22] Filed: Jan. 17, 1997

[30] Foreign Application Priority Data

Sep. 19, 1996 [KR] Rep. of Korea ................... 40798/1996

[51] Int. Cl.[6] ................................................. C23C 14/34
[52] U.S. Cl. .............................. 204/298.11; 204/298.09; 204/192.12
[58] Field of Search .......................... 204/298.09, 298.11, 204/192.12, 298.06

[56] References Cited

U.S. PATENT DOCUMENTS

| 4,717,462 | 1/1988 | Homma et al. .................... 204/298.06 |
| 4,901,667 | 2/1990 | Suzuki et al. ................... 204/298.11 X |
| 5,171,412 | 12/1992 | Talieh et al. .................... 204/298.11 X |
| 5,403,459 | 4/1995 | Guo ................................ 204/298.11 X |
| 5,409,587 | 4/1995 | Sandhu et al. .................. 204/298.11 X |
| 5,529,670 | 6/1996 | Ryan et al. ..................... 204/298.11 X |
| 5,635,036 | 6/1997 | Demarey et al. .............. 204/298.11 X |

*Primary Examiner*—Nam Nguyen
*Attorney, Agent, or Firm*—Fleshner & Kim

[57] ABSTRACT

A semiconductor fabrication apparatus which includes a collimator made of a net type heating material which generates Joule heating when electric power is supplied thereto. The apparatus includes a negative electrode having a metallic target, a positive electrode arranged opposite the negative electrode, on which positive electrode a semiconductor substrate is mounted, and the collimator being mounted between the negative electrode and the positive electrode and near the semiconductor substrate, with the collimator being made of a net type heating material and designed so that Joule heating is generated therein when a current is applied thereto.

2 Claims, 5 Drawing Sheets

SEMICONDUCTOR FABRICATION APPARATUS HAVING IMPROVED SPUTTERING COLLIMATOR AND WIRING METHOD FOR A SEMICONDUCTOR DEVICE USING SUCH APPARATUS

BACKGROUND OF THE INVENTION

1. Field of the Invention

The present invention relates to a semiconductor fabrication apparatus and a wiring method for a semiconductor device using the apparatus, and particularly to a semiconductor fabrication apparatus having an improved sputtering collimator and a wiring method for a semiconductor device using such apparatus which are capable of overcoming a step-coverage problem and a particle formation problem which occur during a wiring process performed by a conventional sputtering method without using an expensive chemical vapor deposition (CVD) process.

2. Description of the Conventional Art

As the integration level of semiconductor devices increases, the aspect ratio of a contact hole for electrical connection of a device is increased. In accordance with the increasing aspect ratio of the contact hole, when burying the contact hole, a step-coverage problem occurs. In order to overcome such problem, various techniques have been studied.

Generally, an electrical wiring process for a semiconductor device is performed by depositing an aluminum film having a low electrical resistance on a substrate by a sputtering process. In order to prevent the phenomenon that a spike of aluminum having a lower melting temperature compared to the substrate is formed due to an interaction between the aluminum and the substrate as the melted aluminum is flown to the substrate, a thin TiN film or a thin TiW film which is a barrier metal film is first deposited on the surface of the substrate including the contact hole, and an aluminum film is deposited on the thusly deposited barrier film so as to form a metallic wire.

The conventional wiring method for a semiconductor device will now be explained in more detail with reference to FIGS. 1A through 1G.

Figure 1A:
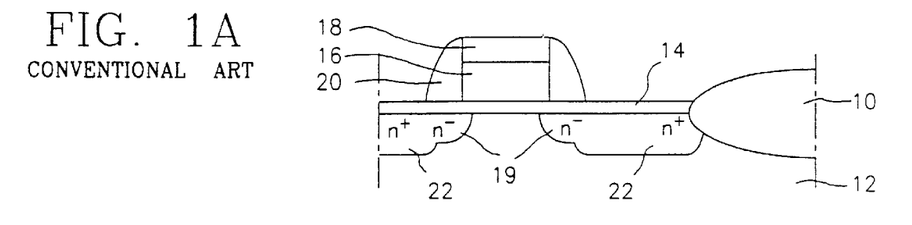
FIGS. 1A through 1G are schematic cross-sectional views illustrating a semiconductor device fabrication for explaining a conventional wiring process for the semiconductor device.

In a first step, as shown in FIG. 1A, a gate insulation film 14, a conductive film (for example, a polycrystalline silicon film), and a first insulation film (for example, an oxidation film) are deposited in order on an active region of a p-type semiconductor substrate 12 having the active region and a device separation region separated by a field oxidation film 10. Thereafter, a photoresist film pattern is formed on the first insulation film by a photolithography process. The first insulation film and the conductive film are etched in order by using the photoresist pattern as a mask, and then a first insulation film pattern 18 and a gate electrode 16 are formed, and the photoresist film pattern is removed. A low density of n-type dopant ions is implanted into the semiconductor substrate 12 by using a self-alignment technique, and a lightly doped n-drain region 19 (hereinafter called an n⁻ LDD region) which has a lower density is formed within the semiconductor substrate 12 at both sides of the gate electrode 16. A second field insulation film 10 is deposited on the front surface of the semiconductor substrate on which the first insulation film pattern 18, the gate electrode 16, and the field oxidation film 10 are formed. Sidewall spacers 20 made of the same material as the second insulation film are formed on the sidewalls of the first insulation film pattern 18 and the gate electrode 16 by etching-back the second insulation film. Source/drain regions 22 having a LDD structure are formed by implanting a high density of n-type dopant ions into the semiconductor substrate using the first insulation pattern 18, the gate electrode 16, and the sidewall spacers 20 as a mask.

Figure 1B:
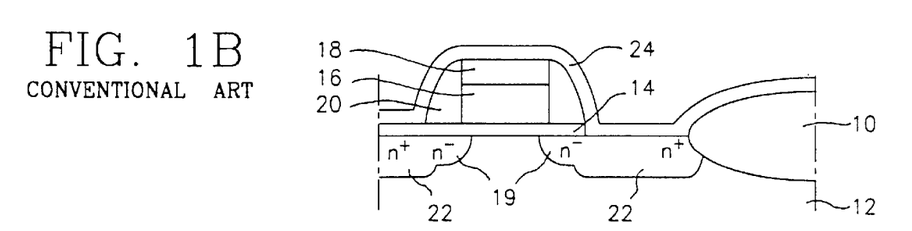

In a second step, as shown in FIG. 1B, the gate insulation film 14 is etched in order for a predetermined portion, in which a contact hole is to be formed later, of the semiconductor substrate 12 of the source/drain region 22 to be exposed, and a third insulation film 24 (for example, an undoped CVD oxidation film) is deposited on the surface of the semiconductor substrate 12 on which the pattern is formed.

Figure 1C:
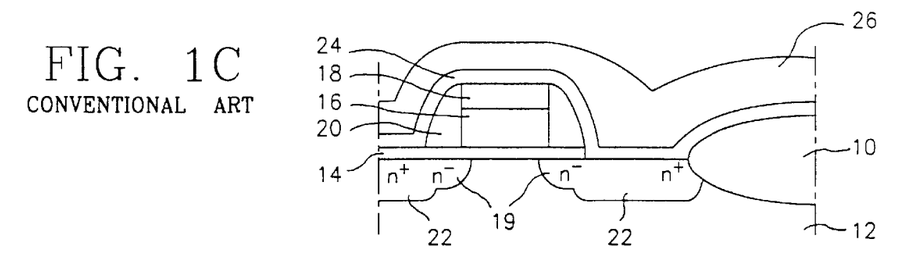

In a third step, as shown in FIG. 1C, a fourth insulation film 26 (for example, a borophosphosilicate glass) is deposited on the third insulation film 24.

Figure 1D:
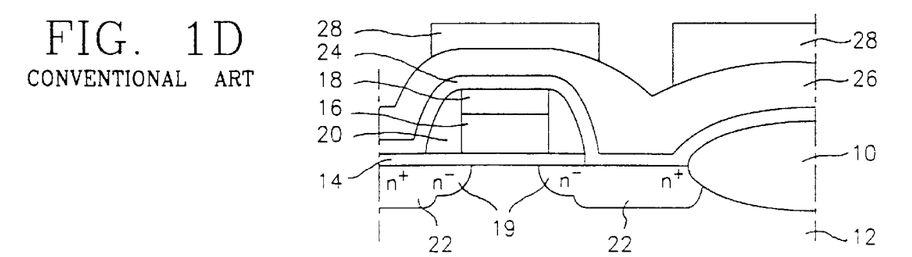

In a fourth step, as shown in FIG. 1D, a photoresist film pattern 28 is formed on the fourth insulation film 26 by a photolithography process.

Figure 1E:
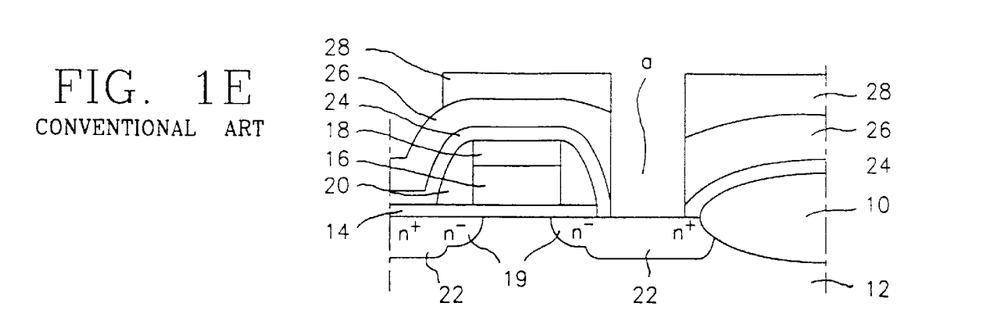

In a fifth step, as shown in FIG. 1E, the fourth insulation film 26 and the third insulation film 24 are selectively etched by using the photoresist pattern 28 as a mask, and a contact hole "a" is formed in order for the semiconductor substrate 12 of the source/drain region 22 to be exposed.

Figure 1F:
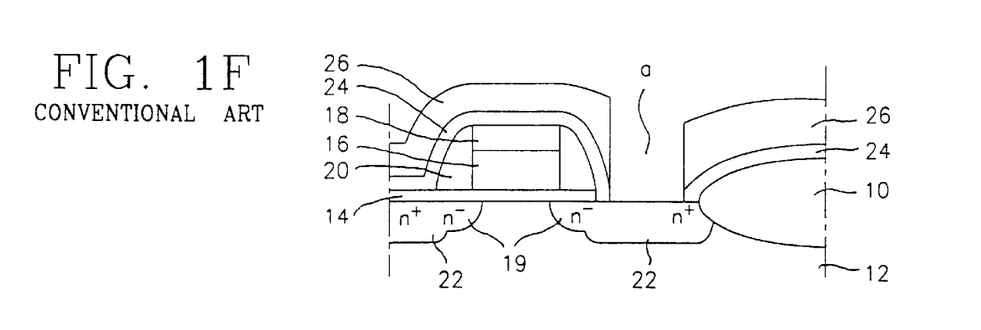
Figure 1G:
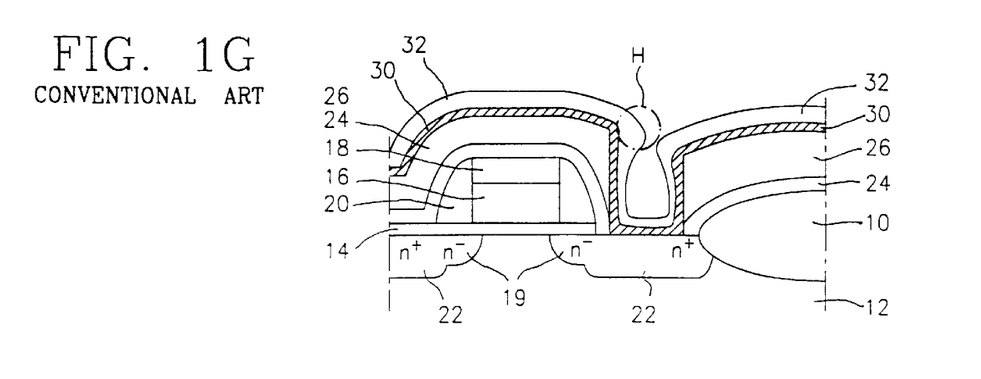

In a sixth step, as shown in FIG. 1F, the photoresist film pattern 28 is removed, and as shown in FIG. 1G, a TiN film or a TiW film which is a barrier metallic film 30 is formed on the fourth insulation film 26 including the contact hole "a" to a thickness of 400–1000 Å by a sputtering process. Here, the barrier metallic film 30 serves to prevent an aluminum spike from being formed due to direct contact between the metallic wiring film 32 and the semiconductor substrate 12. The aluminum film which is the metallic wiring film 32 is deposited on the barrier metallic film 30 to a thickness of 5000–10000 Å by a sputtering process, and then the wiring process for the semiconductor device is finished.

However, such wiring process using the sputtering process has a disadvantage in that it is impossible to bury the contact hole due to the step-coverage when the aspect ratio of the contact hole is increased due to the high integration of the semiconductor device.

In order to overcome such step-coverage problem, a few methods have been introduced into the industry as follows.

Among the methods, there is a method of depositing an aluminum film as a metallic wiring film by using the CVD technique without using a physical vapor deposition (PVD) method such as a sputtering method so as to overcome the step coverage of the contact hole. Therefore, it is possible to deposit the aluminum film in a higher aspect ratio.

There is another method of depositing the aluminum film as a metallic wiring film by sputtering and then heating the aluminum film at a high temperature (for example, at 500°–650° C.), for thus flowing the aluminum to a lower portion of the contact hole so as to form a desired step coverage.

Since the former method is very costly, it is not actually used in the industry. The latter method has advantages in that only a slight change with respect to the existing method is required in actual use, and it is not expensive compared to the CVD method, and the effectiveness thereof is high.

However, since the TiN film or the TiW film which serves as a barrier metallic film has a high melting temperature, such material does not have a desired flowing characteristic like aluminum. Therefore, when depositing such TiN film or TiW film in the contact hole by sputtering, it is impossible to obtain a desired step coverage as well as a TiN film or a TiW film having a predetermined thickness.

In order to overcome the above-described problem, another method directed to changing the structure of the sputtering apparatus for improving the step coverage was introduced in the industry.

Figure 2:
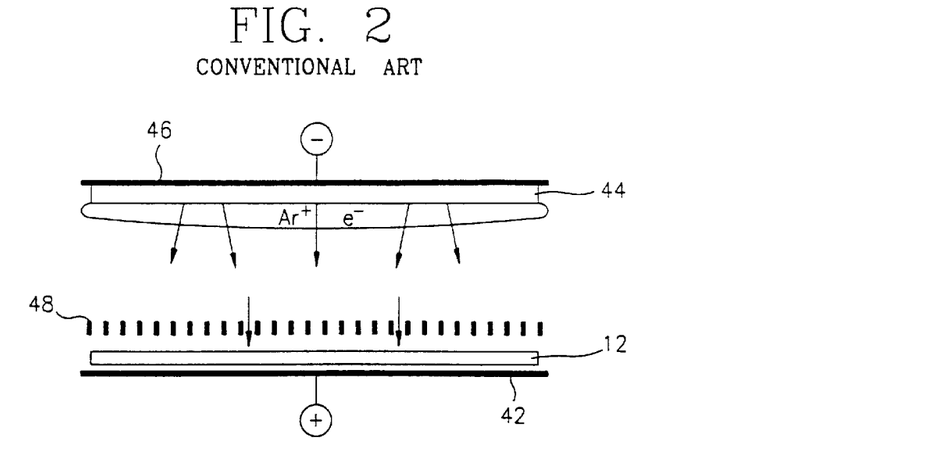
FIG. 2 is a schematic view illustrating a conventional semiconductor fabrication apparatus having a collimator made of a conductive material.

FIG. 2 is a schematic view illustrating a conventional semiconductor fabrication apparatus having a collimator made of a conductive material.

As shown therein, in the conventional sputtering apparatus of the semiconductor fabrication apparatus, a positive electrode 42 on which a semiconductor substrate 12 is placed and a negative electrode 46 to which a metallic target 44 is engaged are arranged opposite to each other. A collimator 48 having a hexagonal net-shaped structure near the semiconductor substrate 12 and made of a conductive material is disposed between the positive electrode 42 and the negative electrode 46.

Here, the semiconductor substrate 12 placed on the positive electrode 42 includes a contact hole "a" formed by the processes as shown in FIGS. 1A through 1G. Here the metallic target 44 is a TiN target or a TiW target.

Therefore, in the sputtering apparatus, the TiN film or the TiW film which acts as a barrier metallic film is deposited in the contact hole "a" as follows.

Namely, when a particle of the TiN target or the TiW target is collided with a plasma (for example, an Ar ion) and is sputtered to the semiconductor substrate 12, the particles colliding with the collimator 48 among the TiN or TiW particles are filtered, and the particles which do not collide with the collimator 48 thereamong pass through. The particles passed through the collimator 48 are stuck to the surface of the contact hole "a" and deposited thereon, so that a TiN film or a TiW film is formed. Namely, the above-described method directed to sputtering particles of a metallic target onto the surface of the contact hole is called a collimated sputtering method.

Therefore, in accordance with the above-described method, it is possible to minimize a step coverage shadow effect caused by an overhang portion "h" as shown in FIG. 1G blocking a target particle from arriving at the bottom portion of the contact hole.

However, the above-described method has the following disadvantages.

Figure 3:
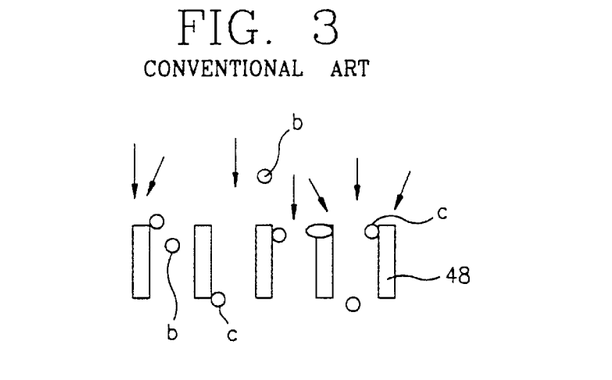
FIG. 3 is a schematic view illustrating metallic target particles passing through the collimator of the apparatus of FIG. 2.

As shown in FIG. 3, a TiN particle or a TiW particle "b" arriving at the surface of the collimator 48 at a predetermined angle not at a vertical angle among the TiN or TiW particles sputtered from the metallic target 44 does not pass through the collimator 48. Namely, such particle indicated by a reference character "c" in FIG. 3 is stuck to the collimator 48, so that the slit size of the collimator 48 is reduced. Therefore, the amount of the TiN particles or the TiW particles arriving at the bottom portion of the contact hole is reduced, for thus decreasing the deposition rate. The deposition rate is decreased more based on the number of the deposition processes. In particular, the particles separated from the collimator 48 may cause a critical problem to the semiconductor device.

Therefore, the above-described problems must be resolved so that the semiconductor fabrication apparatus adapting the conventional collimated sputtering method can serve to fabricate the semiconductor device by mass production.

SUMMARY OF THE INVENTION

Accordingly, it is an object of the present invention to provide a semiconductor fabrication apparatus and a wiring method for a semiconductor device using the apparatus which overcome the problems encountered in the conventional art.

It is another object of the present invention to provide an improved semiconductor fabrication apparatus which is capable of providing a collimator made of an electrically resistive material which generates a Joule heat when electric power is supplied thereto.

It is another object of the present invention to provide an improved semiconductor fabrication apparatus which is capable of overcoming a step-coverage decreasing problem and a particle formation problem which are caused when depositing a wiring material of a semiconductor device by forming a barrier metallic film or a metallic wiring film.

To achieve the above objects, there is provided a semiconductor fabrication apparatus which includes a negative electrode having a metallic target, a positive electrode arranged opposite the negative electrode, on which positive electrode a semiconductor substrate is mountable, and a collimator mounted between the negative electrode and the positive electrode and near the semiconductor substrate, with the collimator being made of an electrically resistive material and designed so that Joule heat is generated therein when a current is applied thereto.

To achieve the above objects, there is also provided a wiring method using a semiconductor fabrication apparatus having a collimator made of a heating material which includes the steps of forming a switching transistor having a gate electrode and a source/drain region in an active region of a semiconductor substrate, forming an insulation film on a surface of the substrate including the switching transistor, forming a contact hole by etching the insulation film in order for the surface of the substrate at the source/drain region to be exposed, forming a barrier metallic film on the insulation film including the contact hole by using a semiconductor fabrication apparatus having a collimator made of an electrically resistive material which collimator is heated by Joule heat which is generated when a current is applied between a negative electrode to which a metallic target is mounted and a positive electrode on which the substrate is mounted, and forming a metallic wiring film on the barrier metallic film including the contact hole.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6A and 6B are views illustrating a sputtering apparatus of which:

FIGS. 7A and 7B are cross-sectional views illustrating a wiring structure of a semiconductor device formed by using the semiconductor fabrication apparatus of FIG. 4, of which:

DETAILED DESCRIPTION OF THE INVENTION

The present invention is basically directed to overcoming a step coverage problem of a barrier metallic film which occurs when depositing an aluminum film by a sputtering process. In addition, a deposition rate decrease based on the number of depositions and a particle formation which are problematic of a conventional collimated sputtering method can be overcome by the improved sputtering apparatus according to the present invention.

Figure 4:
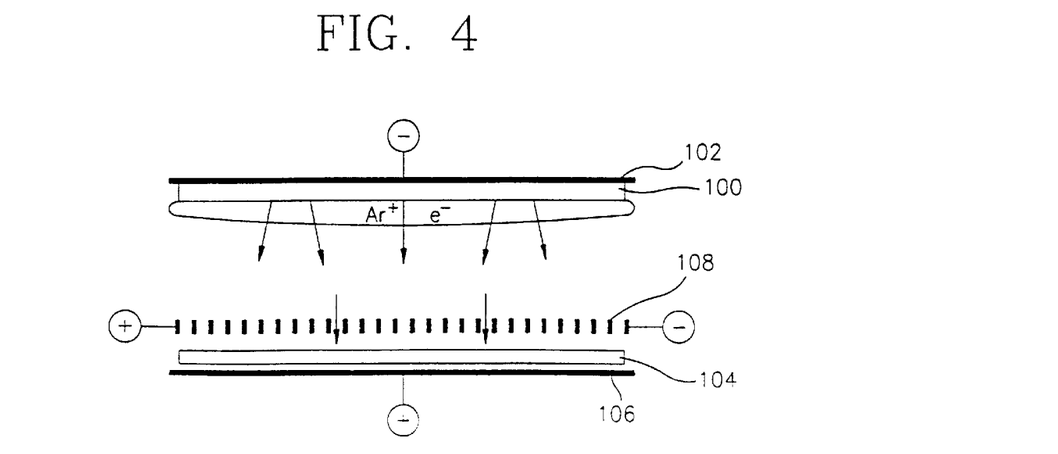
FIG. 4 is a schematic view illustrating a semiconductor fabrication apparatus having a collimator made of an electrically resistive material according to the present invention.

FIG. 4 is a schematic view illustrating a semiconductor fabrication apparatus having a collimator made of a net-type heating material according to the present invention.

As shown therein, a metallic target 100 includes a negative electrode 102 disposed thereon. A semiconductor substrate 104 is placed upon a positive electrode (or a ground electrode) 106. A collimator 108 made of an electrically resistive material is disposed between the negative electrode 102 and the positive electrode 106 and near the semiconductor substrate 104.

Figure 5:
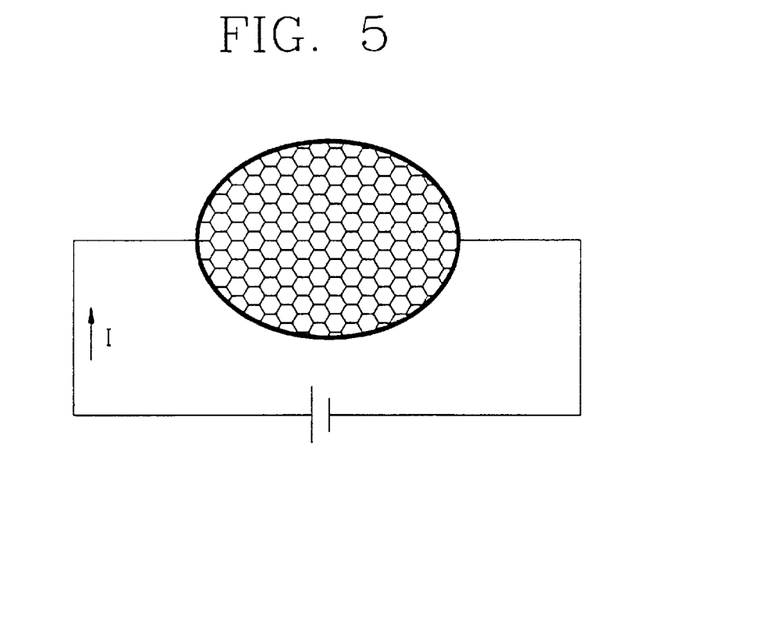
FIG. 5 is a schematic view illustrating the collimator shown in FIG. 4 according to the present invention for explaining a heating principle thereof.

Here, the collimator 108 is made of electrically resistive material having a plurality of hexagonal components, differently from the conventional collimator made of a conductive material, so that when electric power is applied to the collimator 108, Joule heating is generated therein. Namely, as shown in FIG. 5, when a current "I" is applied to the collimator 108, the collimator 108 is heated due to the Joule heating. Therefore, the thusly heated collimator 108 serves as an electrode as well as to collimate, that is, to increase a straightly directed advancing characteristic of metallic particles sputtered thereto.

Namely, the sputtering apparatus according to the present invention is directed to heating the collimator 108 made of a heating material, for thus controlling the temperature of the semiconductor substrate during the sputtering process for depositing a barrier metallic film made of a TiN material or a TiW material or a metallic wiring film of an aluminum material.

When sputtering such metallic materials by using the sputtering apparatus having the above-described characteristics, the following advantages may be obtained.

First, when sputtering metallic materials, since the metallic particles colliding with the heated collimator 108 receive thermal energy from the heated collimator 108, and then pass through the collimator 108, it is possible to overcome the problems of the conventional collimated sputtering method where the particles become stuck to the collimator 108, and the deposition rate is decreased thereby. In addition, even when the metallic particles are stuck to the collimator 108, the metallic particles receive thermal energy from the collimator 108, so that the metallic particles become movable from the collimator 108. Therefore, it is possible to significantly increase the deposition rate. In addition, the metallic particles can be more evenly deposited on the entire surface of the substrate 104, for thus increasing the deposition rate.

Second, since the metallic particles which get stuck to the collimator 108 made of the electrically resistive material receive thermal energy from the heated collimator 108, and are more tightly and evenly stuck to the entire surface of the collimator 108 compared to the conventional collimated sputtering method, it is possible to prevent a particle buildup formation of metallic particles which are not easily separated from the collimator 108.

Third, since the kinetic energy of the metallic particle is increased by receiving thermal energy from the collimator 108, the metallic particles can have a substantial energy after the metallic particles arrive at the substrate, so that the metallic particles can be movable on the substrate, for thus improving the step coverage. In particular, when depositing a metallic material having a lower melting temperature such as an aluminum, since the semiconductor substrate 104 is heated by radiant heat from the collimator 108, it is possible to heat the semiconductor substrate without directly heating the substrate, for thus obtaining a desired step coverage which may be obtained by the wiring process based on the aluminum flowing method.

Figure 6A:
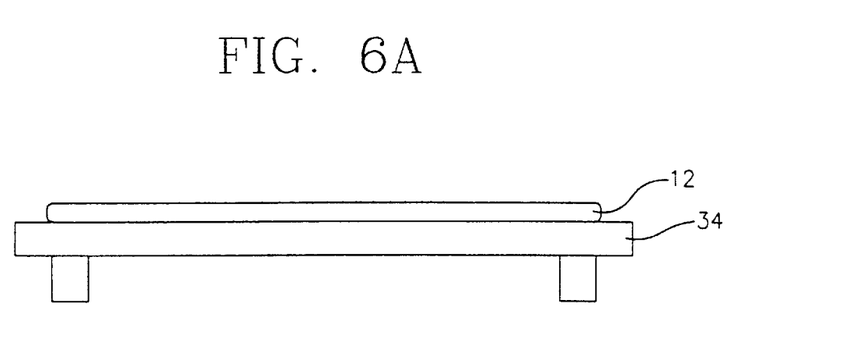
FIG. 6A is a schematic view illustrating the sputtering apparatus for explaining a conventional rear surface direct heating method.
Figure 6B:
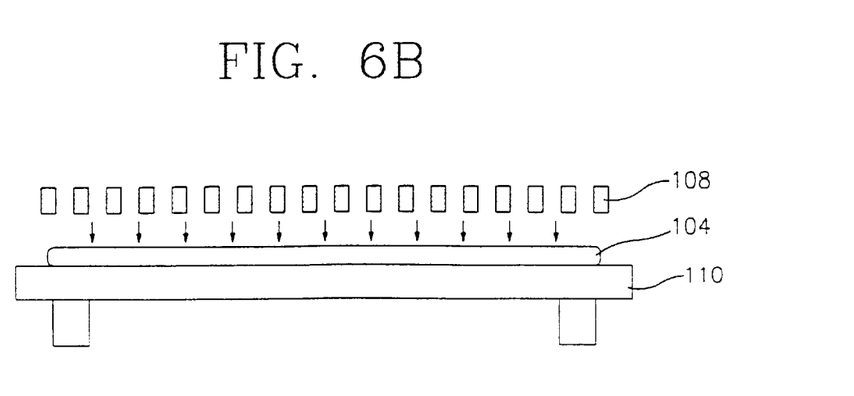
FIG. 6B is a schematic view illustrating the sputtering apparatus for explaining an indirect radiant type front surface heating method according to the present invention.

Fourth, the substrate heating method used in the conventional aluminum flowing method as shown in FIG. 6A is directed to adapting a direct backside heating method which is intended for heating the reverse side of the semiconductor substrate 12 by using a susceptor 34 made of a heating material and transferring the heat to aluminum particles on the front surface of the substrate 12; however, the present invention is directed to using an indirect radiation front side heating method which utilizes radiant heat "Q" from the collimator 108 made of an electrically resistive material for heating the front surface of the substrate. Therefore, it is possible to more easily supply thermal energy to the aluminum particles without providing a thermal load with respect to the substrate. In addition, since the aluminum particles directly receive thermal energy from the collimator 108, the heating efficiency of the aluminum particles may be increased. Namely, it is possible to perform an in-situ substrate heating process when depositing aluminum without overheating the substrate 104 due to the susceptor 34, for thus significantly improving the flowing characteristic of the deposited aluminum.

Figure 7A:
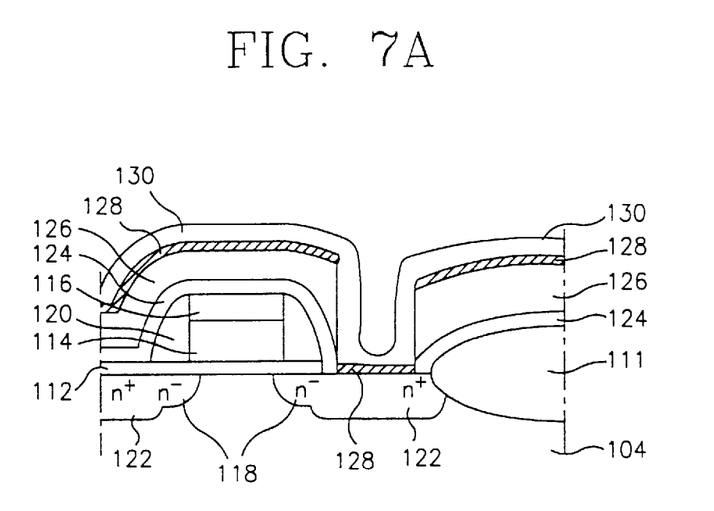
FIG. 7A is a cross-sectional view illustrating a wiring structure in which a wall metal film is formed by using the semiconductor fabrication apparatus of FIG. 4.
Figure 7B:
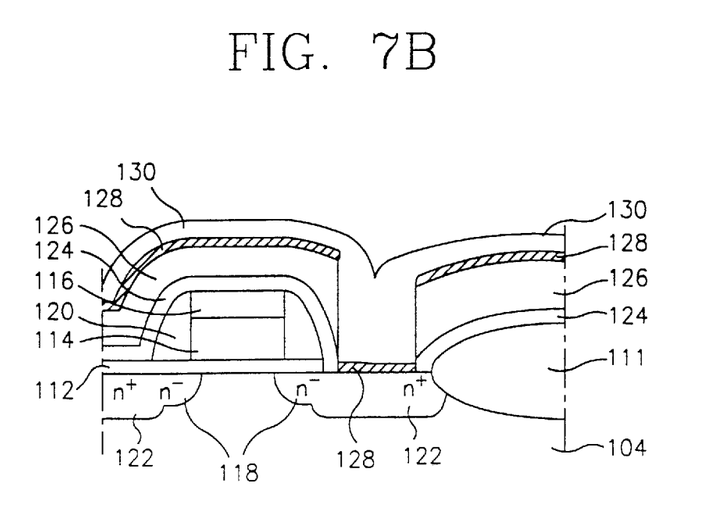
FIG. 7B is a cross-sectional view illustrating a wiring structure in which a wall metal film and a metallic wiring film are formed by using the semiconductor apparatus of FIG. 4.

Referring to FIGS. 7A and 7B, the wiring method for a semiconductor device using the sputtering apparatus having the above-described advantages will now be explained.

First, a wiring process of forming a barrier metallic film formed of a TiN material or TiW material using the sputtering apparatus according to the present invention will be explained with reference to FIG. 7A.

In a first step, a gate insulation film 112, a conductive film (for example, a polycrystalline silicon film), and a first insulation film (for example, an oxidation film) are deposited on an active region of the p-type semiconductor substrate 104 in which an active region and a device isolation region are separated by a field oxidation film 111. A photoresist film pattern is formed on the first insulation film by photolithography. The first insulation film and the conductive film are etched in order using the photoresist film pattern as a mask, for thus forming a first insulation film pattern 116 and a gate electrode 114, and then the photoresist film pattern is removed. A low density of n-type dopant ions is implanted into the semiconductor substrate 104 by a self-alignment method using the first insulation film pattern 116 and the gate electrode 114 as a mask, and a low density n-type dopant ion implantation region (an n- lightly doped drain (n- LDD region)) is formed in the semiconductor substrate 104 at the left and right sides of the gate electrode 114. A second insulation film is deposited on the front surface of the semiconductor substrate 104 on which the first insulation film pattern 116, the gate electrode 114, and the field oxidation film 111 are formed. A sidewall spacer 120 made of a second insulation film material is formed on the side walls of the first insulation film pattern 116 and the gate electrode by etching-back the second insulation film. A high density of n-type dopant ions is implanted into the semiconductor substrate 104 using the first insulation film pattern 116, the gate electrode 114, and the sidewall spacer 120 as a mask, for thus forming source/drain regions 122 of an LDD structure.

In a second step, the gate electrode 112 is etched in order for the surface of the semiconductor substrate 104 of the source/drain regions 122 to be exposed, and a third insulation film 124 (for example, a low temperature oxidation film) is deposited on the front surface of the semiconductor substrate 104 on which the pattern is formed.

In a third step, a fourth insulation film 126 (for example, a BPSG film) is deposited on the third insulation film 124. A photoresist film pattern is formed on the fourth insulation film 126 by photolithography, and the fourth insulation film 126 and the third insulation film 124 are selectively etched using the photoresist film pattern as a mask, for thus forming a contact hole in order for a portion of the semiconductor substrate 104 of the source/drain regions 122 to be exposed, and then the photoresist film pattern is removed.

In a fourth step, a TiN film or TiW film which acts as a barrier metallic film 128 is formed on the fourth insulation film 126 including the contact hole to a thickness of 400–1000 Å by using the sputtering apparatus as shown in FIG. 5. The above-described process will now be explained in more detail in three sub-steps.

Namely, in a first sub-step, the substrate 104 having a contact hole is mounted on the positive electrode 106 (or a ground electrode 106)) of the sputtering apparatus.

In a second sub-step, the metallic target 100 for example TiN target or a TiW target to deposited is mounted on the negative electrode 102.

In a third sub-step, a plasma (for example, of $Ar^+$ ions) is generated between the negative electrode 102 and the positive electrode 106. The collimator 108 made of an electrically resistive material having a plurality of holes is applied with a current therethrough, for thus generating heat. The substrate 104 is heated by the heat transferred thereto from the collimator 108. Therefore, the temperature of the substrate is increased. In the above-described state, TiN particles or TiW particles separated from the metallic target 100 after a collision with the plasma are sputtered, whereby a TiN film or TiW film as the barrier metallic film 128 is deposited on the fourth insulation film 126 including the contact hole. At this time, since only the TiN target particles or the TiW target particles having a straightly moving characteristic are deposited on the substrate 104 in cooperation with the collimator 108, the barrier metallic film 128 is deposited on only the upper portion of the fourth insulation film 126 and the bottom area of the contact hole as shown in FIG. 7A. Here, the barrier metallic film 30 serves to prevent an Al spike which occurs due to a direct contact between the Al film to be formed later and the substrate 104.

During the above-described process, since the kinetic energy of the TiN particles or the TiW particles which receive a thermal energy from the collimator 108 is increased, the TiN particles or TiW particles can be movable on the substrate 104 since they passes a substantial energy upon arriving at the substrate. Therefore, it is possible to form the barrier metallic film 128 having a substantial thickness in the bottom region of the contact hole having a high aspect ratio, for thus significantly improving the step-coverage.

In a fifth step, an Al film which acts as a metallic wiring film 130 is deposited on the barrier metallic film 128 to a thickness of 5000–100000 Å, and then the substrate 104 is heat-treated. Thereafter, the wiring film formation process according to the present invention is finished. The above-described heat treatment process may be omitted.

Next, in the case of forming the barrier metallic film and the metallic wiring film by using the sputtering apparatus, the wiring formation process will be explained with reference to FIG. 7B.

Here, since the first through fourth steps are performed in the same manner as the process shown in FIG. 7A, description thereof will be omitted.

Namely, through the first through fourth steps, an insulation film is deposited on the front surface of the semiconductor substrate 104 in which a switching transistor is formed, and this insulation film is etched in order for the surface of the semiconductor substrate at the source/drain regions 122 of the switching transistor to be exposed, for thus forming a contact hole. A TiN film or TiW film which is the barrier metallic film 128 is formed on the upper portion of the insulation film and the bottom portion of the contact hole to a thickness of 400–1000 Å by using the sputtering apparatus as shown in FIG. 5.

In a fifth step, an Al film as a metallic wiring film 130 is formed on the barrier metallic film 128 including the contact hole to a thickness of 5000–10000 Å by using the sputtering apparatus as shown in FIG. 5, and then the wiring formation process of a semiconductor device according to the present invention 130 is finished. The above-described process will be explained in more detail in three sub-steps.

In a first sub-step, the semiconductor substrate 104 having the barrier metallic film 128 is mounted on the positive electrode 106 (or a ground electrode) of the sputtering apparatus.

In a second sub-step, the metallic target 100 (for example, an Al target) to be deposited is mounted on the negative electrode 102.

In a third sub-step, a plasma (for example, of $Ar^+$ ions) is generated between the negative electrode 102 and the positive electrode 106, and a current is applied to the collimator 108, for thus heating the collimator 108 which is made of an electrically resistive material. The substrate 104 is heated by a radiant heat "Q" from the collimator 108. Therefore, the temperature of the substrate 104 is increased. When Al particles are separated from the metallic target 100 by collision with the plasma to be sputtered, a metallic wiring film 130 is deposited on the barrier metallic film 128 including the contact hole.

During the process for forming the metallic wiring film 130, since the Al particles which are a low melting temperature directly receive a thermal energy from the collimator 108 by an indirect radiant front surface heating, the Al melts and flows and completely buries the contact hole of the substrate. FIG. 7B is a cross-sectional view illustrating the wiring structure in which a wall metal film and a metallic wiring film are formed by using the semiconductor fabrication apparatus of FIG. 4.

Namely, when forming the metallic wiring film by using Al having a low melting temperature, since an in-situ substrate heating can be performed when depositing the Al film without heating the semiconductor substrate 104 by using a susceptor 110, it is possible to significantly improve the flowing characteristic of the deposited Al film.

As described above, the semiconductor fabrication apparatus and the wiring method for a semiconductor device using the apparatus according to the present invention have advantages in that (1) it is possible to more easily perform a wiring process of a highly integrated semiconductor device by using the sputtering apparatus having a collimator made of an electrically resistive without using an expensive CVD process, (2) it is possible to enhance the deposition rate and quality compared with the wiring process using the existing collimated sputtering method, (3) it is possible to more effectively prevent clogging of the collimator since the particles are more tightly stuck to the collimator made of an electrically resistive compared to the conventional art, (4) it is possible to overcome the step-coverage problem of the contact hole having a high aspect ratio since the metallic particles having a substantial energy are more movable on the substrate due to receiving thermal energy from the collimator made of an electrically resistive material, and (5) it is possible to improve an Al flowing characteristic for obtaining a step-coverage compared to a wiring process based on the conventional Al flowing method without additionally heating the substrate.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A sputtering apparatus for fabricating a semiconductor device comprising:

a negative electrode having a metallic target;

a positive electrode arranged opposite the negative electrode, on which the positive electrode a semiconductor substrate is mountable;

a collimator mounted between the negative electrode and the positive electrode and near the semiconductor substrate; and current applying means that applies an electrical current to the collimator, whereby Joule heating is generated in the collimator, wherein the collimator is positioned sufficiently close to the semiconductor substrate to heat the semiconductor substrate with radiative heat generated by the collimator.

2. The apparatus of claim 1, wherein said collimator is made of an electrically resistive material.

* * * * *